United States Patent [19]

Mearig

[11] 4,379,737

[45] Apr. 12, 1983

[54] METHOD TO MAKE A BUILT UP AREA ROTARY PRINTING SCREEN

[75] Inventor: Stephen G. Mearig, Mountville, Pa.

[73] Assignee: Armstrong World Industries, Inc., Lancaster, Pa.

[21] Appl. No.: 322,456

[22] Filed: Nov. 18, 1981

[51] Int. Cl.³ .............................................. C25D 1/08
[52] U.S. Cl. ...................................................... 204/11
[58] Field of Search .......................................... 204/11

[56] References Cited

U.S. PATENT DOCUMENTS

| | | | |
|---|---|---|---|
| 3,402,110 | 9/1968 | Scherrer | 204/11 |
| 3,759,800 | 9/1973 | Reinke | 204/11 |
| 4,080,267 | 3/1978 | Castellani | 204/15 |
| 4,184,925 | 1/1980 | Kenworthy | 204/11 |

Primary Examiner—T. M. Tufariello

[57] ABSTRACT

A rotary printing screen is made with selected areas being provided with a perforated mesh region through which printing ink may be passed. These mesh areas are provided with a mesh pattern recessed back from the exterior surface of the rotary printing screen so as to permit greater ink deposition thicknesses. The screen is formed by an electro-metal deposition method which provides a basic conventional screen structure. The mesh areas are then masked and an additional deposition of material is provided in the non-mesh areas to build up these areas and, consequently, provide a recessed area in the region of the originally formed mesh design.

1 Claim, 6 Drawing Figures

METHOD TO MAKE A BUILT UP AREA ROTARY PRINTING SCREEN

BACKGROUND OF THE INVENTION

1. Field of the Invention

The invention is directed to a method of making a rotary printing screen and, more particularly, to a method of forming by electro-metal deposition a rotary printing screen with each of the mesh areas having a mesh design in an area depressed from the external surface of the rotary printing screen.

2. Description of the Prior Art

U.S. Pat. No. 4,184,925 teaches the fabricating of an orifice plate for a jet drop recorder by a technique requiring alternate photoresist and nickel plating operations. The first resist and plating sequence results in an orifice recess on one side of the plate while the second sequence produces a large cavity on the side of the plate opposite the recess. The second plating step also thickens the orifice plate.

U.S. Pat. No. 4,080,267 relates to a thick self-supporting mask for electronic beam projection processes made by multiple steps of coating with resist, exposure, development, and plating. Second and third sequences of the same steps generate large apertures in the mask.

U.S. Pat. No. 3,759,800 discloses a method of making a rotary printing screen whereby an electro-deposited metal sleeve is etched to produce a pattern of holes. A fabric sleeve is mounted over the metal sleeve and further plating of the metal sleeve with the fabric sleeve in place locks the fabric on the metal sleeve. A printing image is then built up on the screen providing openings which are much larger than the openings in th fabric thereby permitting more air to pass through the metal base and giving finer detail in the printing operation.

U.S. Pat. No. 3,772,160 teaches electroforming a printing screen whereby a nickel pattern comprising the masking surface of the pattern to be reproduced is first electro-deposited, then an eutectic alloy is deposited onto the nickel surface and a wire screen is pressed into the alloy layer. The screen bridges the gaps in the nickel mask layer representing the symbol to be reproduced.

SUMMARY OF THE INVENTION

The method to be used to make a built up area screen is as follows. First, coat, expose and then develop a photoresist coating on a mandrel surface with the desired printing pattern which has the areas through which ink passes defined as a mesh area. The resist coated mandrel surface is plated in a conventional manner to the desired thickness. The plated screen is left on the mandrel and a second photoresist coating is applied over the entire mandrel surface. The photoresist coating is exposed to polymerize those areas where the mesh is located on the original plated screen and not exposed in those areas which are not preforated by a mesh pattern. The new resist coating is developed and the resulting product is then plated by a conventional means. The plating is carried out to provide a surface of desired thickness. When the plating is stopped and the screen is removed from the tank and cleaned up, it will be found that in those areas where there is no mesh pattern, the screen is at least of double thickness. In those areas where there is a mesh pattern, the screen is of a single thickness with an enlarged recess open area being disposed between the mesh pattern and the outside surface of the rotary screen printer.

DESCRIPTION OF THE PREFERRED EMBODIMENT

Figure 1:
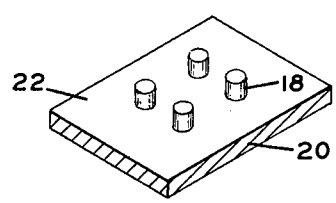
FIG. 1 is a perspective view of developed resist coating.

It is desired to produce a rotary printing screen which is capable of depositing increased quantities of ink or other coating materials over that normally deposited with a conventional rotary printing screen. The screen would be particularly useful for depositing ink on relatively thick substrates such as resilient flooring material or carpeting. Normally, a rotary screen is provided with a mesh area with a certain design through which ink is passed to deposit the ink in the design of the mesh area. The periphery of the mesh area defines the design and the mesh area is really a plurality of holes within the periphery of the mesh area. Normally, the perforations of the mesh area extend completely through the thickness of the rotary screen. This means that all of the ink being pushed through a single hole in the mesh must penetrate completely into the substrate. No deposition of an ink will be left on the surface of the substrate because the outside surface of the screen is against the substrate and any ink within the perforation will stay within the perforation as the screen rotates away from the substrate. In order to get a deposition of an ink on a substrate, the structure of FIG. 6 of the drawing is needed. Here the substrate 2 has the rotary screen 4 pressing thereagainst. The outside surface of the screen 6 is in contact with the upper surface of the substrate 2. Printing ink will be in the region 8 and will pass through the perforations 10 and 12 to be deposited on the substrate. Normally, the perforations would be in the form of the single perforation 14 shown in dotted line on the left of FIG. 6. Thus, it will be seen that any ink within the perforation 14 would stay within that perforation when the screen 4 and substrate 2 separate and no deposition of excess material would be left on the surface of the substrate. It should be noted that the perforations in the screen are in the order of about 8 mils in diameter and conventional printing ink would be, by surface tension, retained within the perforation upon the separation of the printing screen and substrate rather than dripped out of the perforation onto the surface of the substrate.

For simplicity herein the mesh area through which the ink penetrates is being shown as either two perforations or as four perforations. In reality, the real product is made with 300–1000 perforations per square inch and a region that has a plurality of perforations therein is called the mesh area of the screen, and this has a particular shape or design based upon the peripheral shape or design of the mesh. Ink passing through all the holes in the mesh will form a printing on a substrate of the shape of the periphery of the mesh area. In those areas where it is not desired that ink pass through the screen, the area is not perforated and no mesh pattern exists. By looking at FIG. 6, when ink passes through the perforations 10 and 12, there is a recessed chamber 16 therebelow which will receive excess ink and permit excess ink to sit on the surface of the substrate 2. In some printing operations, this would be desirable and it can be accomplished only by the structure of FIG. 6.

Figure 6:
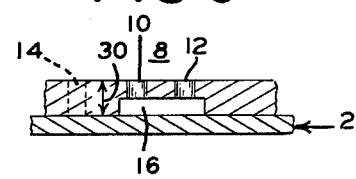
FIG. 6 is a cross-sectional view of a portion of rotary printing screen.

In order to accomplish the structure of FIG. 6, the below defined method must be utilized. The method utilizes the electro deposition of metal on a surface that has been provided with a pattern due to the use of photoresist materials. Photoresist materials form a raised pattern around which the metal is electrically deposited. Consequently, if one was trying to make a solid sheet, there would be no resist deposited upon the surface to be plated. In areas where one wished to form a mesh or perforated pattern, then a plurality of columns of resist would be formed in the arrangement and shape that one desired to have the perforations in the end product. Metal is then deposited around these columns of resist material and there is formed a metallic surface having a plurality of perforations therein, the perforations being in the shape and design of the columns of resist.

In order to form a rotary printing screen, the resist material must be deposited on some surface. Normally, this surface is in the form of a mandrel which is basically nothing more than a cylindrical sleeve which has on the outside thereof a surface which can have photoresist material adhered thereto. The first step of the process is to coat the outside surface of the mandrel with a photoresist material such as the Shipley Co. Photoresist AZ119 which is a positive photoresist. This resist is deposited to a thickness of about 1 mil. A film is placed thereover with the film containing a pattern similar to that which one desires to form in the resist. The film is exposed in a conventional manner using UV light collimated to get parallel rays of light. The exposure is carried out from 15 minutes to 3 hours, depending upon the specific resist material being utilized. The resist material is then developed and the mandrel washed resulting in the forming on the surface of the mandrel of a deposition of hardened resist material in a pattern, the pattern being determined by the image on the film. Up to this point, what has been performed is conventional in the art. In forming the rotary screen, there will be formed areas where no resist is present at all, and this will form non-perforated areas of the rotary screen. In other areas on the mandrel, there will be formed little columns of resist material. The columns will be grouped in areas to form a pattern and the periphery area of these groups of columns of resist will define the mesh periphery. The columns of resist will form the perforations which will be in the metal coating that will be deposited subsequently on the mandrel coated with the resist. For simplicity's sake, in FIG. 1, there is shown just a portion of a mandrel with four columns 18 of resist material formed on the surface of the mandrel 20. These columns of resist material stand up about 1 mil in height and would be approximately 8 mils in diameter.

Figure 2:
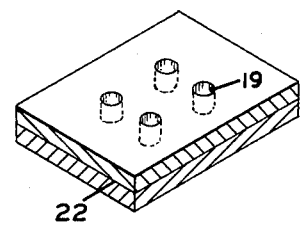
FIG. 2 is a perspective view of a plated pattern formed from the resist coating of FIG. 1.
Figure 3:
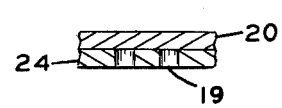
FIG. 3 is a side view of FIG. 2.
Figure 4:
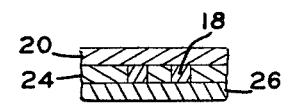
FIG. 4 is the FIG. 3 structure covered with a resist coating prior to development.
Figure 5:
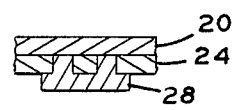
FIG. 5 is the structure of FIG. 4 after the resist coating has been exposed and developed.

The mandrel is now placed in a conventional plating tank to electro deposit metal, preferably nickel, upon the surface of the mandrel. About 3 to 4 mils of metal are deposited on the surface of the mandrel in a conventional manner. In FIG. 1, in the region 22 of the mandrel 20 where no resist exists, a solid surface of nickel will be formed. In the region of the columns of resist 18, the metal will be deposited around the columns 18 and the columns of resist will, in effect, have nickel formed therearound. When the resist is ultimately removed from the surface of the nickel, there would then be provided perforations through the nickel. The structure resulting from the nickel plating operation of FIG. 1 will then look like the structure of FIG. 2 wherein the columns 18 of resist are removed and the region 22 is covered with nickel along with all of the area adjacent and in between the holes 19 where the columns 18 had been. Assuming that the nickel coated surface was removed from the mandrel in FIG. 2 and one looked at that structure in cross-section, one would see a structure similar to that of FIG. 3 wherein the holes 19 are shown completely surrounded by a deposition of nickel material 24. Referring now to FIG. 4, the nickel plated surface 24 of mandrel 20 is still formed with the columns of resist 18 therein. Alternatively, the column 18 could have been washed therefrom when the product of the first plating operation was cleaned up and prepared for the next plating operation. The second resist coating 26 is then deposited over the previously plated surface 24. The resist material will bridge the holes 19 which exist in the layer 24 or will simply fill the holes 19 formed during the first plating operation. The second resist 26 could be Kodak KPR photoresist which would be sprayed on the surface 24 and this would completely cover the surface 24 to a depth of about 3 mils and would fill in the areas 18 should they not still contain resist material. By the use of DuPont "Riston" resist sheet material which would simply be laid or laminated across layer 24, a resist coating 26 would be formed, and this would simply bridge the holes 19 rather than filling them. Now one will place another film over top of the resist and the purpose of this film is to form the recessed areas in the region of the mesh pattern formed by the holes in the first coating 24. Exposure and development of the second resist coating is carried out in a conventional manner and a structure similar to FIG. 5 is formed wherein the second layer of resist is now left as a hardened resist coating in the region 28, and the region 28 is within the perimeter of the mesh area defined by the plurality of perforations in the layer 24. The original coating 24 of nickel is activated or washed with a 50% hydrochloric acid solution or other nickel activation techniques in order to prepare it for a subsequent plating operation. The mandrel with the first plating layer 24 thereon and the second resist coating 28 thereon is then inserted into a conventional plating tank, and the plating is carried out at a slightly lower than normal plating condition wherein the plating is carried out at a lower current density of 10 to 20 amp/ft$^2$. This then deposits on the surface of layer 24 in the region where there is no resist another nickel coating of 10 mils which combines with the nickel coating 24 to form the thick nickel layer defined and shown in FIG. 6 as thickness 30. However, due to the presence of the resist 28 in the area of the mesh pattern, a recessed area 16 is formed. After the second nickel plating operation is carried out, the resist area 28 is washed out of the area 16 and the perforations 10 and 12 are cleaned out and the plated metal sleeve is removed from the mandrel. Now one has perforations 10 and 12 leading into enlarged area 16 and there is thus provided a mesh area defined by apertures 10 and 12 spaced from the surface of substrate 2 due to the presence of the area 16. Consequently, there is now provided a structure which will permit the deposition of printing ink or other coating material upon the surface of the substrate being printed.

What is claimed is:

1. A method of forming a rotary printing screen wherein the screen is initially formed by coating a resist material on a conventional plating mandrel, placing a film over the resist material and exposing the resist material through the film to form a mesh pattern in the resist material, then developing the exposed resist material to result in a mesh pattern of hardened resist material on the plating mandrel, then plating the mandrel in a conventional manner so that plating material is not deposited on the mandrel where a resist material exists, or overplated over the resist, but is deposited in the areas where no resist material exists, to form a plated surface with perforations therein, the improvement comprising:
   (a) coating the outside surface of the newly plated surface with a second resist coating;
   (b) placing a film over the second resist coating;
   (c) exposing the film to collimated light to sensitize the second resist material in selected regions beneath the photographic film;
   (d) developing the exposed resist to provide on the first plated surface a pattern of second resist material existing in some areas and no second resist material existing in other areas, the second resist material existing on the plated surface only in those areas of the first plating that has perforations therethrough, said second resist covering plural perforations and said second resist material filling said perforations and covering the areas surrounding the perforations;
   (e) plating the original plated surface with the second resist pattern thereon to form a second plated surface which becomes integral with the first plated surface in those areas where no resist material exists, but with no second plated surface being provided in those areas where the second resist coating exists, the outside surface of the second plated surface forming the exterior surface of the printing screen;
   (f) washing and cleaning the plated surface and removing the plated surface from the plating mandrel to form a cylindrical rotary printing screen with different areas of perforations in a pattern defining a mesh pattern formed by the first resist with the areas of perforations (which is) spaced from the exterior surface of the screen by a single large open area formed by the second resist.

* * * * *